(12) United States Patent
Sato et al.

(10) Patent No.: US 12,674,232 B2
(45) Date of Patent: Jul. 7, 2026

(54) LAMINATE AND METHOD OF MANUFACTURING LAMINATE

(71) Applicant: Toray Advanced Film Co., Ltd., Tokyo (JP)

(72) Inventors: Yoshikazu Sato, Iwase-gun (JP); Yoshiro Murofushi, Iwase-gun (JP); Kodai Tokunaga, Otsu (JP); Makoto Sato, Otsu (JP)

(73) Assignee: Toray Advanced Film Co., Ltd., Tokyo (JP)

( * ) Notice: Subject to any disclaimer, the term of this patent is extended or adjusted under 35 U.S.C. 154(b) by 241 days.

(21) Appl. No.: 18/285,870

(22) PCT Filed: Mar. 31, 2022

(86) PCT No.: PCT/JP2022/016559
§ 371 (c)(1),
(2) Date: Oct. 6, 2023

(87) PCT Pub. No.: WO2022/224797
PCT Pub. Date: Oct. 27, 2022

(65) Prior Publication Data
US 2024/0183021 A1     Jun. 6, 2024

(30) Foreign Application Priority Data

Apr. 19, 2021    (JP) ................................. 2021-070170
Apr. 19, 2021    (JP) ................................. 2021-070171

(51) Int. Cl.
*C23C 14/24*       (2006.01)
*C23C 14/08*       (2006.01)

(52) U.S. Cl.
CPC ............ *C23C 14/081* (2013.01); *C23C 14/24* (2013.01)

(58) Field of Classification Search
None
See application file for complete search history.

(56) References Cited

U.S. PATENT DOCUMENTS

2013/0043466 A1*   2/2013   Nomura ............. H10D 30/6739
                                 257/E29.296

FOREIGN PATENT DOCUMENTS

| | | | |
|---|---|---|---|
| JP | S63-222849 | A | 9/1988 |
| JP | H10-323933 | A | 12/1998 |
| JP | 2000-043182 | A | 2/2000 |
| JP | 2005-324469 | A | 11/2005 |
| JP | 2008-036948 | A | 2/2008 |
| JP | 2008-121122 | A | 5/2008 |
| JP | 2013-028018 | A | 2/2013 |
| JP | 2013-234365 | A | 11/2013 |
| JP | 2017-177343 | A | 10/2017 |
| WO | WO-2013015315 | A1 * | 1/2013 ........... C23C 14/548 |

OTHER PUBLICATIONS

Machine Translation of WO 2013015315 (Year: 2013).*
International Search Report dated Jul. 5, 2022 in counterpart International Application No. PCT/JP2022/016559 w/English translation.
Written Opinion dated Jul. 5, 2022 in counterpart International Application No. PCT/JP022/016559.

* cited by examiner

*Primary Examiner* — Sheeba Ahmed
(74) *Attorney, Agent, or Firm* — DLA Piper LLP (US)

(57) ABSTRACT

A laminate has a layer A on at least one side of a base material, in which the layer A contains at least aluminum (Al) and oxygen (O), and when a site corresponding to 5.0 to 25.0%, a site corresponding to 40.0 to 60.0%, and a site corresponding to 75.0 to 95.0%, in terms of length in a depth direction in the layer A, are defined as an X portion, a Y portion, and a Z portion, respectively, there are sites having a different composition ratio O/Al of aluminum (Al) and oxygen (O). There are provided a laminate that exhibits high productivity and less variation in gas barrier properties even with a thin film configuration, and a method for manufacturing a laminate.

11 Claims, 5 Drawing Sheets

Width direction

20

19

Width direction

20

19

Width direction

LAMINATE AND METHOD OF MANUFACTURING LAMINATE

TECHNICAL FIELD

This disclosure relates to a laminate having excellent barrier properties against oxygen and water vapor, which can be suitably used as a packaging material for foods, pharmaceuticals, electronic components and the like, and a method of manufacturing a laminate.

BACKGROUND

A gas barrier film formed by forming an inorganic compound film of silicon oxide, aluminum oxide or the like on a surface of a film base material by a physical vapor deposition (PVD) method such as a vacuum vapor deposition method, a sputtering method, and an ion plating method, or a chemical vapor deposition (CVD) method such as a plasma chemical vapor deposition method, a thermal chemical vapor deposition method, and a photochemical vapor deposition method is used for packaging various articles such as foods, pharmaceuticals, and industrial goods which require blocking of various gases such as water vapor and oxygen.

As a method of satisfying having high gas barrier properties, there have been proposed a method of providing an undercoat layer between a base material and an inorganic compound layer for the purpose of planarizing the base material and improving adhesion (Japanese Patent Laid-open Publication No. 2000-043182), a method of providing a planarization layer between the base material and the gas barrier layer and further providing a planarization layer formed by a sol-gel method using a composition containing another metal alkoxide and/or a hydrolyzate thereof laminated on an outer surface of the gas barrier layer (Japanese Patent Laid-open Publication No. 2005-324469), and a method of forming a plurality of layers on the base material and further providing a gas barrier coating layer formed by curing a polymerizable acrylic monomer or a mixture of a monomer and an oligomer on the plurality of layers (Japanese Patent Laid-open Publication No. 2008-036948).

However, the method of using the undercoat layer described in JP '182 is superior in terms of reducing defects of the inorganic compound layer and improving adhesion to the surface of the base material by smoothing the surface of the base material, but has a problem in productivity because the number of manufacturing steps is high. In addition, as described in JP '469 and JP '948, the method of using the laminated configuration is superior in terms of less variation in barrier properties and mechanical properties, but this method also has a problem in productivity because the number of manufacturing steps is high. Further, the increase in the number of steps causes an increase in cost from the viewpoint of quality assurance in each step.

It could therefore be helpful to provide a laminate that exhibits high productivity and less variation in gas barrier properties even with a thin film configuration, and a method of manufacturing a laminate.

SUMMARY

We thus provide:
(1) A laminate having a layer A on at least one side of a base material, in which the layer A contains at least aluminum (Al) and oxygen (O), and when a site corresponding to 5.0 to 25.0%, a site corresponding to 40.0 responding to 40.0 to 60.0%, and a site corresponding to 75.0 to 95.0%, in terms of length in a depth direction in the layer A, are defined as an X portion, a Y portion, and a Z portion, respectively, there are sites having a different composition ratio O/Al of aluminum (Al) and oxygen (O).
(2) A laminate having a layer A on at least one side of a base material, in which the layer A contains at least aluminum (Al) and oxygen (O), and when a peak intensity in the vicinity of 530 eV of an oxygen K-edge spectrum in EELS analysis in the layer A is defined as I(530), and a peak intensity in the vicinity of 540 eV is defined as I(540), $I(530)/I(540) \leq 1.50$ is satisfied.
(3) A method of manufacturing the above-described laminate, in which a vapor deposition layer is formed on at least one surface of the base material by evaporating aluminum by a vacuum vapor deposition method and introducing oxygen into aluminum vapor.

It is thus possible to provide a laminate that exhibits high productivity and less variation in gas barrier properties even with a thin film configuration, and a method of manufacturing a laminate.

BRIEF DESCRIPTION OF THE DRAWINGS

FIG. 3 is a schematic view schematically showing an example of an oxygen gas introduction pipe in a winding-type vacuum deposition apparatus for manufacturing the laminate.

DESCRIPTION OF REFERENCE SIGNS

Figure 1:
FIG. 1 is a cross-sectional view showing an example of our laminate.

1: Base material
2: Layer A
3: Winding-type vacuum deposition apparatus
4: Winding chamber
5: Unwinding roll
6, 7, 8: Unwinding guide roll
9: Main drum
10, 11, 12: Unwinding guide roll
13: Winding roll
14: Ion source
15: Evaporation source
16*a*, 16*b*, 16*c*, 16*d*: Oxygen gas introduction pipe
17: Electron gun (EB gun)
18: Deposition preventive plate
19: Oxygen gas introduction pipe
20: Gas introduction port

DETAILED DESCRIPTION

Hereinafter, our laminates and methods will be described in detail.

Laminate

Our preferred laminate is a laminate having a layer A on at least one side of a base material, in which the layer A contains at least aluminum (Al) and oxygen (O), and when a site corresponding to 5.0 to 25.0%, a site corresponding to 40.0 to 60.0%, and a site corresponding to 75.0 to 95.0%, in terms of length in a depth direction in the layer A, are defined as an X portion, a Y portion, and a Z portion, respectively, there are sites having a different composition ratio O/Al of aluminum (Al) and oxygen (O). The elements contained in the layer A may include other elements as long as the elements include at least aluminum (Al) and oxygen (O). For example, hydrogen (H), carbon (C), nitrogen (N), silicon (Si) and the like may be included.

Aluminum (Al) and oxygen (O) being contained in the layer A means that the content of elements is 5.0 atm % or more for any element in 100.0 atm % of all atoms constituting the layer A, which is detected when evaluation is performed by a High Resolution Rutherford Backscattering Spectrometry (HR-RBS)/High Resolution Hydrogen Forward scattering Spectrometry (HR-HFS) method under the conditions described in the Examples.

The HR-RBS/HR-HFS method is a method of irradiating an object with high-speed ions, acquiring the energy spectra of ions Rutherford backscattered by atomic nuclei in a solid and hydrogen atoms scattered forward by elastic recoil, and obtaining an elemental composition present in the object. Detailed evaluation conditions are as described in Examples. The graph of the composition ratio with respect to the depth direction can be obtained by this method. However, for example, when the laminate has a two-layer structure of the layer A and the base material, since the region up to 0.4 nm in the surface layer of the layer A includes information on surface contamination, the composition of the layer A is calculated from a position deeper than the surface layer of 0.4 nm. In addition, since the interface between the layer A and the base material is affected by the base material, when the average carbon amount $C_1$ of the base material and the average carbon amount $C_2$ of the layer A are defined, the site of $(C_1+C_2)/2$ is defined as a reference interface between the layer A and the base material, and a region from the reference interface to a surface layer of 0.4 nm is defined as a measurement region of the layer A in the HR-RBS/HR-HFS method. Unless otherwise specified, the average composition of the layer A is calculated by averaging the measurement results at each measurement point in the measurement region. Specifically, first, an average carbon amount of the layer A and the base material is determined as an appropriate temporary interface with a place considered to be an interface as a reference interface between the layer A and the base material. The average carbon amount of the layer A and the base material is determined using a reference interface between the layer A and the base material derived from the determined average carbon amount. By repeating this, a reference interface at which each average carbon amount converges is defined as a reference interface between the layer A and the base material. When there is a layer adjacent to the layer A when having another layer between the layer A and the base material, the reference interface is determined from the average carbon amount of the layer A and the adjacent layer in the same manner as described above. When there are layers adjacent to each of both surfaces of the layer A, each reference interface obtained in the same manner as described above is used instead of the site of the surface layer of 0.4 nm.

When measurement is performed by the HR-RBS/HR-HFS method, the X portion, the Y portion, and the Z portion in the layer A are defined as follows. The X portion refers to a site of 5.0 to 25.0% in terms of length with respect to the thickness of the inorganic compound layer specified by the HR-RBS/HR-HFS method. The Y portion indicates 40.0 to 60.0% at the center with respect to the thickness of the layer A. Furthermore, the Z portion indicates a site of 75.0 to 95.0% with respect to the thickness. When the base material can be specified, for example, when the laminate has a two-layer structure of the layer A and the base material, the interface between the layer A and the base material side is set to 0%, and the outermost surface is set to 100%. When another layer is provided between the layer A and the base material, the interface between the layer A and the other layer is set to 0%. When there are a plurality of other layers, the interface between the layer adjacent to the layer A and the layer A is set to 0%. When there are layers adjacent to each of both surfaces of the layer A, the interfaces with each of the adjacent layers are appropriately set to 0% and 100%. In addition, the composition of each site is calculated by averaging the measurement results at each measurement point in each site.

Further, at the time of EELS measurement to be described later, in the layer A, the X portion, the Y portion, and the Z portion are defined as follows. The X portion indicates a site of 5.0 to 25.0% in terms of length with respect to the layer A thickness specified from the cross-sectional observation image by a scanning transmission electron microscope (STEM). The Y portion indicates 40.0 to 60.0% at the center with respect to the thickness of the layer A. Furthermore, the Z portion indicates a site of 75.0 to 95.0% with respect to the thickness. A value measured from a cross-sectional observation image by a scanning transmission electron microscope (STEM) is used as the thickness of the layer A, and when the base material can be specified, for example, when the laminate has a two-layer structure of the layer A and the base material, the interface between the layer A and the base material side is set to 0%, and the outermost surface is set to 100%. When another layer is provided between the layer A and the base material, the interface between the layer A and the other layer is set to 0%. When there are a plurality of other layers, the interface between the layer adjacent to the layer A and the layer A is set to 0%. When there are layers adjacent to each of both surfaces of the layer A, the interfaces with each of the adjacent layers are appropriately set to 0% and 100%.

The fact that there is a site where the composition ratio O/Al of aluminum (Al) and oxygen (O) is different means that there is a difference of 0.10 or more in any of the values of the composition ratio O/Al of each of the X portion, the Y portion, and the Z portion defined above, which have been measured by the HR-RBS/HR-HFS method. On the other hand, when there is a site having a different composition ratio O/Al, when the difference is 0.50 or less, the numbers of sites having a large amount of Al peroxide and sites having a large amount of Al suboxide are reduced with respect to the average composition of the layer A, and the film has good barrier properties and less variation, which is preferable.

Since there are sites where the composition ratio O/Al differs in the depth direction in the layer A, a dense site and a relatively sparse site having high flexibility can be mixed in the same film. When the entire layer A is a dense film in the depth direction, the film may be a film which is easily cracked and in which in-plane variation is likely to occur because the film is a hard film. On the other hand, by mixing dense sites and highly flexible sites in the same film in the depth direction, it is possible to realize a film which is unlikely to crack and has good barrier properties with less in-plane variation.

From the same viewpoint, it is preferable that any one of the values of the X portion, the Y portion, and the Z portion has a difference of 0.15 or more. In addition, as sites having a difference, it is preferable that there is a difference of 0.10 or more between the X portion and the Y portion, and/or there is a difference of 0.10 or more between the Z portion and the Y portion. Specific measurement conditions of the element ratio of Al and O in the layer A are as described in Examples. In addition, the laminate is employed in which, when there are a plurality of layers containing aluminum (Al) and oxygen (O), on at least one layer, when there are sites where the composition ratio O/Al differs in the depth direction in the layer A, the A layer is provided, the layer A contains at least aluminum (Al) and oxygen (O), and when a site corresponding to 5.0 to 25.0%, a site corresponding to 40.0 to 60.0%, and a site corresponding to 75.0 to 95.0%, in terms of length in a depth direction in the layer A, are defined as an X portion, a Y portion, and a Z portion, respectively, there are sites having a different composition ratio O/Al of aluminum (Al) and oxygen (O). One layer indicates a part including a boundary surface distinguishable from an adjacent part toward a thickness direction and having a finite thickness. More specifically, as described in Examples, when a cross section of the layer A is observed with a scanning transmission electron microscope (STEM), the one layer indicates the layer distinguished by a discontinuous boundary surface. Even when the composition changes in the thickness direction of the layer A, the layer A is treated as one layer when the above-described boundary surface is not present.

Figure 3:
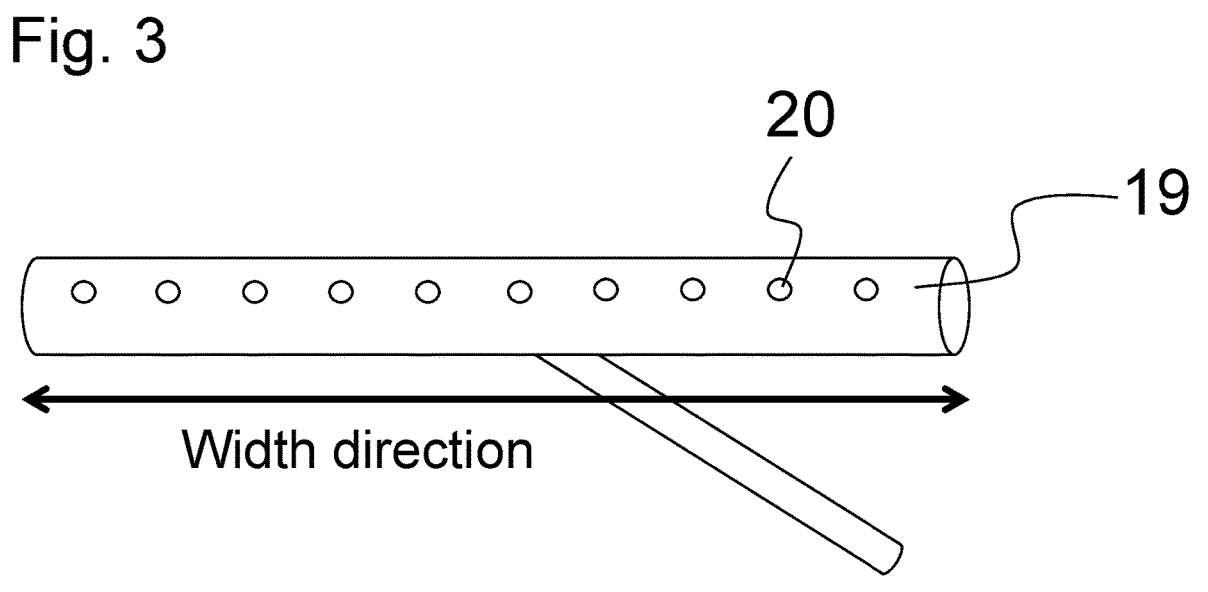
Figure 4:
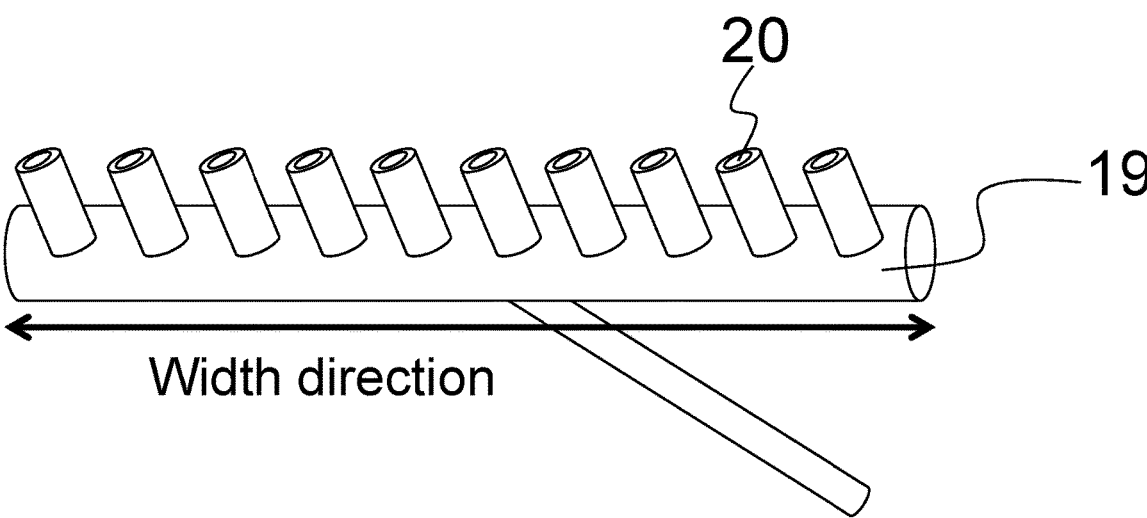
FIG. 4 is a schematic view schematically showing an example of the oxygen gas introduction pipe in the winding-type vacuum deposition apparatus for manufacturing the laminate.

As a means of producing a laminate in which there are sites where the composition ratio O/Al of aluminum (Al) and oxygen (O) is different when the layer A contains at least aluminum (Al) and oxygen (O) and the X portion, the Y portion, and the Z portion are defined in the depth direction in the layer A, means for appropriately setting the introduction position, the introduction amount, and the introduction method of oxygen gas is preferable. Specifically, taking the winding-type vacuum deposition apparatus 3 shown in FIG. 2 as an example, regarding the introduction amount of oxygen gas, the amount of oxygen gas introduced is preferably 2 to 19 L/min when evaporating aluminum at a degree of pressure reduction of $5.0 \times 10^{-3}$ Pa or less, a base material conveyance speed of 400 m/min, a base material width of 1.0 m, and a target thickness of the layer A of 8 nm at the time of forming the layer A. As a method of introducing the oxygen gas, it is preferable to use a tubular shape in which an introduction direction is one direction as shown in FIG. 4 from the viewpoint of introducing oxygen into each of the X portion, the Y portion, and the Z portion in a pinpoint manner. Since the gas introduction port has a tubular shape as shown in FIG. 4, the directivity of the gas introduced from the gas introduction port is high, and a target position can be efficiently oxidized. The pinhole shape as shown in FIG. 3 allows the oxygen gas introduced from the gas introduction port to uniformly permeate into the aluminum vapor, but may be inferior to the tubular shape from the viewpoint of oxidizing the target site at pinpoint.

In particular, from the viewpoint of reducing variations in barrier properties, regarding the composition ratio O/Al, preferably, the composition ratio O/Al in the X portion≠the composition ratio O/Al in the Y portion and/or the composition ratio O/Al in the Y portion≠the composition ratio O/Al in the Z portion. From the same viewpoint, regarding the composition ratio O/Al, preferably, the composition ratio O/Al in the X portion>the composition ratio O/Al in the Y portion and/or the composition ratio O/Al in the Y portion<the composition ratio O/Al in the Z portion.

Preferably, hydrogen (H) is further contained in the layer A, and when peak intensities in the vicinity of 530 eV of an oxygen K-edge spectrum of an electron energy loss spectroscopy (EELS) analysis in each of the X portion, the Y portion, and the Z portion are defined as $I_X(530)$, $I_Y(530)$, and $I_Z(530)$, and peak intensities in the vicinity of 540 eV of the oxygen K-edge spectrum of the EELS analysis in each of the X portion, the Y portion, and the Z portion in the layer A are defined as $I_X(540)$, $I_Y(540)$, and $I_Z(540)$, $I_Y(530)/I_Y(540)>I_X(530)/I_X(540)$ and/or $I_Y(530)/I_Y(540)>I_Z(530)/I_Z(540)$ is satisfied. Furthermore, the EELS analysis is measured by Scanning Transmission Electron Microscopy—Electron Energy Loss Spectroscopy (STEM-EELS) described above.

When there are a plurality of layers containing aluminum (Al) and oxygen (O), on at least one layer, when $I_Y(530)/I_Y(540)>I_X(530)/I_X(540)$ and/or $I_Y(530)/I_Y(540)>I_Z(530)/I_Z(540)$ is satisfied, the laminate has the layer A, the layer A contains at least aluminum (Al) and oxygen (O) and further contains hydrogen (H), and when peak intensities in the vicinity of 530 eV of an oxygen K-edge spectrum of an electron energy loss spectroscopy (EELS) analysis in each of the X portion, the Y portion, and the Z portion are defined as $I_X(530)$, $I_Y(530)$, and $I_Z(530)$, and peak intensities in the vicinity of 540 eV of the oxygen K-edge spectrum of the EELS analysis in each of the X portion, the Y portion, and the Z portion in the layer A are defined as $I_X(540)$, $I_Y(540)$, and $I_Z(540)$, $I_Y(530)/I_Y(540)>I_X(530)/I_X(540)$ and/or $I_Y(530)/I_Y(540)>I_Z(530)/I_Z(540)$ is satisfied.

The peak in the vicinity of 530 eV in the oxygen K-edge spectrum in the EELS analysis is derived from hydroxide, and the peak in the vicinity of 540 eV is a mixed peak of Al and O. That is, when each of the peak intensities is defined as $I(530)$ and $I(540)$, the amount of hydroxide in the film increases as the value of $I(530)/I(540)$ increases, and the amount of hydroxide in the film increases as the value decreases.

Satisfying $I_Y(530)/I_Y(540)>I_X(530)/I_X(540)$ and/or $I_Y(530)/I_Y(540)>I_Z(530)/I_Z(540)$ means that the amount of hydroxide in the outer part (X portion and/or Z portion) is smaller than that in the Y portion. Since the amount of hydroxide in the outer part (X portion and/or Z portion) is smaller than that in the Y portion, the denseness of the outer part (X portion and/or Z portion) is higher than that in the Y portion, and it is possible to prevent moisture from entering the layer A from the outside. That is, preventing moisture from entering the layer A from the outside leads to minimizing a change in film quality of the layer A, and thus film quality variation can be reduced. As a result, variations in water vapor permeability can be further reduced. From the viewpoint of the variation in film quality and barrier properties described above, $I_Y(530)/I_Y(540)>I_X(530)/I_X(540)$ is more preferable, and $I_Y(530)/I_Y(540)>I_X(530)/I_X(540)$ and $I_Y(530)/I_Y(540)>I_Z(530)/I_Z(540)$ are still more preferable.

Figure 2:
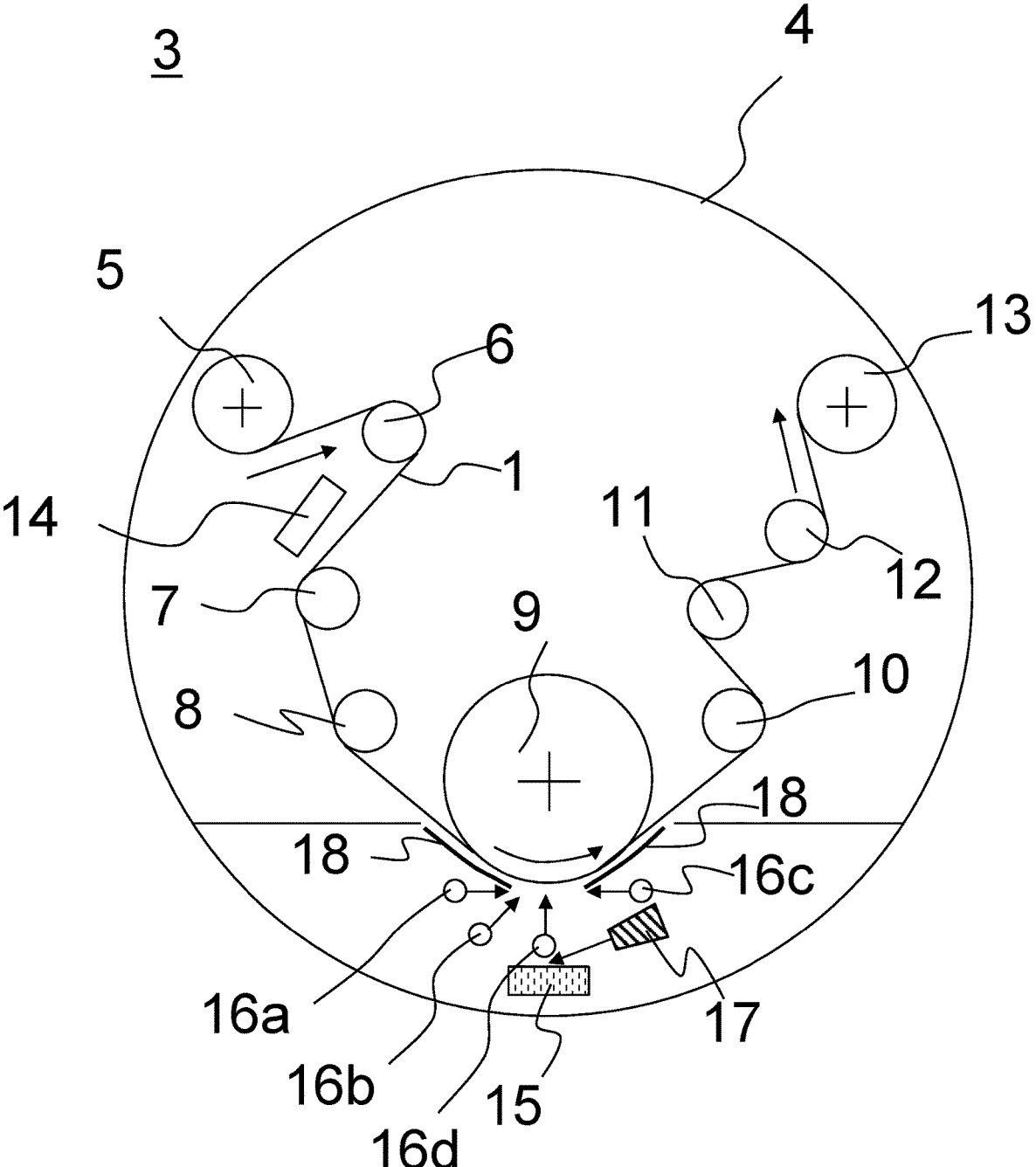
FIG. 2 is a schematic view schematically showing a winding-type vacuum deposition apparatus for manufacturing the laminate.

Means for appropriately setting the introduction position, the introduction amount, and the introduction method of oxygen gas is adopted, and the details are the same as the contents described above, but when the winding-type vacuum deposition apparatus 3 shown in FIG. 2 is taken as an example, $I_X(530)/I_X(540)$ can be lowered by using an oxygen gas introduction pipe having a tubular shape in which the introduction direction is one direction as shown in FIG. 4 and introducing a large amount of oxygen to the upstream side of the base material and/or introducing a large amount of oxygen directly above the evaporation source compared when not doing so. By introducing a large amount of oxygen immediately above the evaporation source, $I_Y(530)/I_Y(540)$ can be reduced compared when not doing so. By introducing a large amount of oxygen to the downstream side of the base material and/or introducing a large amount of oxygen immediately above the evaporation source, $I_Z(530)/I_Z(540)$ can be lowered compared when not doing so. In addition, the value of $I(530)/I(540)$ can be lowered as a whole by further increasing the degree of pressure reduction, that is, lowering the atmospheric pressure.

Hydrogen (H) in the layer A being contained means containing 5.0 atm % or more of hydrogen as an average composition in the layer A when evaluation is performed by the HRRBS/HR-HFS method under the conditions described in Examples. By containing hydrogen (H), flexibility can be imparted to the laminate.

Preferably, the layer A is formed on a film including a base material, and $I_X(530)/I_X(540) \leq 0.15$ and/or $I_Z(530)/I_Z(540) \leq 0.25$ is satisfied in the X portion and the Z portion in the layer A. When $I_X(530)/I_X(540) \leq 0.15$ and/or $I_Z(530)/I_Z(540) \leq 0.25$ is satisfied, the amount of hydroxide in the X portion close to the base material and/or the Z portion far from the base material is reduced to form a dense film, and therefore the barrier properties are improved. From the viewpoint of barrier properties, $I_X(530)/I_X(540) \leq 0.11$ and/or $I_Z(530)/I_Z(540) \leq 0.20$ is more preferable, and $I_X(530)/I_X(540) \leq 0.083$ and/or $I_Z(530)/I_Z(540) \leq 0.15$ is still more preferable.

In addition, our preferred laminate has a layer A on at least one side of a base material, in which the layer A contains at least aluminum (Al) and oxygen (O), and when a peak intensity in the vicinity of 530 eV of an oxygen K-edge spectrum in EELS analysis in the layer A is defined as I(530), and a peak intensity in the vicinity of 540 eV is defined as I(540), $I(530)/I(540) \leq 1.50$ is satisfied.

The EELS analysis is electron energy loss spectroscopy, and is a method of analyzing an element composition and a chemical bonding state of a measurement sample by spectroscopically analyzing electrons (inelastic scattered electrons) after electrons are incident on the measurement sample and the incident electrons lose energy by interaction with the measurement sample. The inelastic scattering to be analyzed is inner shell electron excitation (50 eV or more), interband transition by excitation of valence electrons (0 to 10 eV), and plasmon excitation by collective vibration of electrons (10 to 50 eV). The oxygen K-edge spectrum indicates an absorption spectrum of the inner shell electron region in the EELS spectrum. The peak intensity I(530) in the vicinity of 530 eV is the intensity of the peak top detected between 528.0 and 531.0 eV. However, when a plurality of peak tops are detected between 528.0 and 531.0, the intensity at the peak top having the highest peak intensity is adopted, and when no peak top is detected, the intensity at 530 eV is adopted. The peak intensity I(540) in the vicinity of 540 eV is the intensity of the peak top detected between 535.0 and 545.0 eV. However, when a plurality of peak tops are detected between 535.0 and 545.0 eV, the intensity at the peak top having the highest peak intensity is adopted, and when no peak top is detected, the intensity at 540 eV is adopted.

The peak in the vicinity of 530 eV in the oxygen K-edge spectrum in the EELS analysis is a peak derived from hydroxide, and the peak in the vicinity of 540 eV is a mixed peak of Al and O. That is, when each of the peak intensities is defined as I(530) and I(540), the amount of hydroxide in the film increases as the value of I(530)/I(540) increases, and the amount of hydroxide in the film increases as the value decreases. When the values of $I(530)/I(540)$ in the X portion, the Y portion, and the Z portion in the layer A are $I_X$, $I_Y$, and $I_Z$, the sum $(I_X+I_Y+I_Z)$ of $I_X$, $I_Y$, and $I_Z$ is defined as I(530)/I(540) of the layer A. The detailed EELS analysis method is as described in the Examples. When $I(530)/I(540) \leq 1.50$ is satisfied in the layer A, the number of sites where the amount of hydroxide is large in the entire film area in the layer A is reduced, and thus a laminate having less variation in barrier properties and good barrier properties is obtained. When $I(530)/I(540)>1.50$ is satisfied in the layer A, the amount of hydroxide increases in a certain region in the film, and voids and defects tend to occur accordingly, the region can serve as a water vapor transmission path, and thus variation in barrier properties tend to occur. From the above viewpoint, I(530)/I(540) is more preferably 1.00 or less, and still more preferably 0.50 or less in layer A. In addition, when the amount of hydroxide is extremely small, the layer A tends to be hard and easily cracked, and thus I(530)/I(540) is preferably 0.20 or more in the layer A.

Electron energy loss spectroscopy (EELS) is measured by Scanning Transmission Electron Microscopy—Electron Energy Loss Spectroscopy (STEM-EELS). As pretreatment of the sample before STEM-EELS measurement, a focused ion beam (FIB) method is used. Specifically, a sample for cross-sectional observation is prepared using a micro sampling system based on the method described in "Polymer Surface Processing" (written by Satoru Iwamori), pp. 118 to 119. At that time, all samples are handled in a glove box (under a nitrogen atmosphere) except when carbon vapor deposition for the purpose of imparting conductivity is performed to the surface. Detailed measurement conditions are as in Examples. The outline of the position of the layer containing aluminum (Al) and oxygen (O) is grasped by the above-described HRRBS/HR-HFS method, and the interface of the layer is grasped by STEM measurement. EELS measurement is performed on the X portion, the Y portion, and the Z portion of the layer, I(530) and I(540) of each part of the layer are obtained, and I(530)/I(540) of the layer is obtained. When there are a plurality of layers containing aluminum (Al) and oxygen (O), on at least one layer, when $I(530)/I(540) \leq 1.50$, the laminate has the layer A, in which the layer A contains at least aluminum (Al) and oxygen (O), and when a peak intensity in the vicinity of 530 eV of an oxygen K-edge spectrum in EELS analysis in the layer A is defined as I(530), and a peak intensity in the vicinity of 540 eV is defined as I(540), $I(530)/I(540) \leq 1.50$ is satisfied.

The layer A contains at least aluminum (Al) and oxygen (O), and preferable examples of means for achieving $I(530)/I(540) \leq 1.50$ in the layer A include the following method. One layer indicates a part including a boundary surface distinguishable from an adjacent part toward a thickness direction and having a finite thickness. More specifically, as described in Examples, when a cross section of the layer A is observed with a scanning transmission electron microscope (STEM), the one layer indicates the layer distinguished by a discontinuous boundary surface. Even when the composition changes in the thickness direction of the layer A, the layer A is treated as one layer when the above-described boundary surface is not present.

Figure 5:
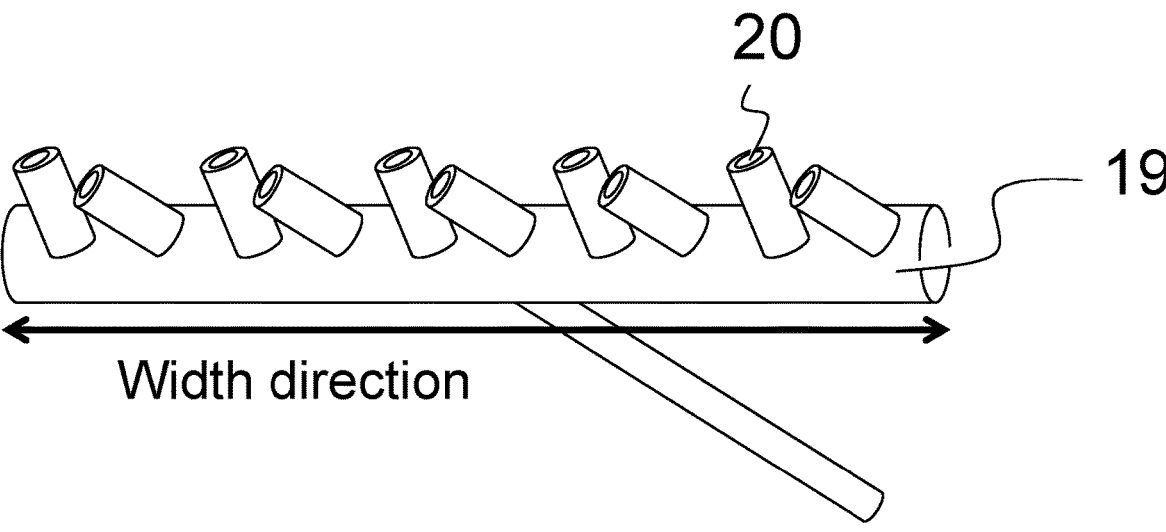
FIG. 5 is a schematic view schematically showing an example of the oxygen gas introduction pipe in the winding-type vacuum deposition apparatus for manufacturing the laminate.

To adjust the amount of hydroxide and the amount of oxide contained in the layer A to appropriate amounts, an appropriate amount of oxygen is introduced into aluminum vapor in formation of the layer A by an appropriate method, and then the upstream side of the base material and the downstream side of the base material can be achieved by covering the upstream side of the base material and the downstream side of the base material with a deposition preventive plate. When the amount of the introduced oxygen gas is small, the amount of metal Al and Al suboxide increases, the site is easily hydroxylated by atmospheric exposure after formation of the layer A, and thus the amount of hydroxide in the layer A increases. On the other hand, when the amount of the introduced oxygen gas is large, the amount of oxygen having a dangling bond is large, H is bonded to the site by atmospheric exposure after the formation of the layer A to be hydroxylated, and thus the amount of hydroxide in the layer A is large. As a method of introducing an appropriate amount of oxygen by an appropriate method, for example, a method is preferable in which the amount of oxygen gas introduced is 2 to 19 L/min when evaporating aluminum at a degree of pressure reduction of $5.0 \times 10^{-3}$ Pa or less, a base material conveyance speed of 400 m/min, a base material width of 1.0 m, and a target thickness of the layer A of 8 nm at the time of forming the layer A. In addition, as a method of introducing the oxygen gas, it is preferable to have a pinhole shape as shown in FIG. 3. With the pinhole shape, the oxygen gas introduced from the gas introduction port can be uniformly permeated into the aluminum vapor, and the aluminum vapor and the oxygen gas can be efficiently reacted without variation. For the introduction of the oxygen gas, a tubular shape of which the introduction direction is one direction as shown in FIG. 4 or a tubular shape of which the introduction direction is a plurality of directions as shown in FIG. 5 can be used, but these shapes have high directivity of the gas introduced from the gas introduction port, and when the gas is introduced into the aluminum vapor, reaction unevenness with the aluminum vapor may be likely to occur, and variation in the film may be likely to occur.

In addition, as a reason to cover the upstream side of the base material and the downstream side of the base material with the deposition preventive plate, the upstream side of the base material greatly affecting the film quality of the interface portion (X portion) of the layer A and the downstream side of the base material greatly affecting the film quality of the surface portion (Z portion) of the layer A have low aluminum vapor density and are likely to be different from the center portion (Y portion) in film quality, and thus are likely to cause variations. Therefore, by covering the upstream side of the base material and the downstream side of the base material with the deposition preventive plate, the variation can be reduced.

From the viewpoint of improving the film quality of the entire layer A, the oxygen gas is preferably introduced from immediately above the evaporation source. From the above viewpoint, it is more preferable to introduce from the upstream side and/or the downstream side of the base material in addition to immediately above the evaporation source.

The thickness of the layer A is preferably 15.0 nm or less. When the thickness of the layer A is 15.0 nm or less, the barrier properties is good and the bending resistance is excellent. From the same viewpoint, the thickness is more preferably 10.0 nm or less, still more preferably 8.0 nm or less, and particularly preferably 7.0 nm or less. The thickness of the layer A can be determined from cross-sectional observations by scanning transmission electron microscope (STEM).

When the thickness of the layer A is X (nm) and the water vapor permeability is Y(g/m²/day), X×Y≤20.0 is preferably satisfied. When X×Y≤20.0 is satisfied, barrier properties can be exhibited even in a thin film. From the viewpoint of productivity and cost, X×Y≤15.0 is more preferable, and X×Y≤8.0 is still more preferable. The water vapor permeability can be measured under an environment of 40° C. and 90% RH using a water vapor permeability meter. The day in the measurement unit corresponds to 24 hours.

The total light transmittance of the laminate is preferably 85.0% or more. When the total light transmittance of the laminate is 85.0% or more, the visibility of the contents is excellent. The total light transmittance can be measured using a haze meter.

With respect to the average composition of the layer A, the composition ratio of aluminum (Al) and oxygen (O) is preferably 1.20≤O/Al≤2.20. When 1.20≤O/Al≤2.20, the proportion of aluminum present as aluminum oxide or aluminum hydroxide, but not metal aluminum, in the layer A increases, and thus transparency and barrier properties are improved. From the viewpoint of transparency and barrier properties, more preferably, 1.40≤O/Al≤2.10. The element ratio of Al and O in the layer A is measured by the HR-RBS/HR-HFS method. Specific measurement conditions are as described in the Examples. In addition, even when O/Al=1.5, aluminum is not necessarily a complete oxide, and there is a possibility that aluminum contains a hydroxide or Al suboxide or Al peroxide. It is considered that, this is because even when adhesion of moisture in the atmosphere during vapor deposition or moisture after vapor deposition is prevented, residual moisture in the vapor deposition tank, moisture contained in the base material and the like are taken into the film during vapor deposition or after vapor deposition.

From the viewpoint of ensuring barrier properties and flexibility, in the layer A, preferably, with respect to the average composition of the layer A, aluminum (Al) atomic concentration:oxygen (O) atomic concentration:hydrogen (H) atomic concentration is 15.0 to 40.0:40.0 to 55.0:10.0 to 35.0 (atm %). The average composition of the layer A is measured by the HR-RBS/HR-HFS method. Specific measurement conditions are as described in Examples.

From the same viewpoint, the Al atomic concentration:O atomic concentration:H atomic concentration is more preferably 20.0 to 35.0:40.0 to 55.0:15.0 to 30.0 (atm %). In addition, the concentrations of nitrogen (N) atoms and carbon (C) atoms are each preferably 5 atm % or less.

One Example of Method of Manufacturing Layer A

The method of forming the layer A is not particularly limited, and a vacuum vapor deposition method, a sputtering method, a reactive sputtering method, a molecular beam epitaxy method, a cluster ion beam method, an ion plating method, an atomic layer deposition method, a plasma polymerization method, an atmospheric pressure plasma polymerization method, a plasma CVD method, a laser CVD method, a thermal CVD method, a coating method or the like can be used. From the viewpoint of manufacturing cost, gas barrier properties and the like, it is preferable to use a vacuum vapor deposition method.

The layer A can be formed on at least one surface of the base material by evaporating aluminum by a vacuum vapor deposition method and introducing oxygen into aluminum vapor. Examples of the method of evaporating aluminum by a vacuum vapor deposition method include an electron beam (EB) vapor deposition method, a resistance heating method, an induction heating method and the like, but are not limited thereto. By adjusting the evaporation amount of aluminum by the above method and then introducing oxygen into the aluminum evaporation gas, the layer A in which the amount of oxygen and the film quality are controlled can be obtained. As long as the gas to be introduced contains oxygen, an inert gas or the like may be contained as another gas for film quality control.

Preferably, oxygen is introduced from the upstream side and/or the downstream side of the base material. It is preferable to introduce oxygen from the position toward the boil-off gas direction of aluminum. By introducing oxygen as described above, the film quality of the X portion and/or the Z portion of the layer A is improved, and the barrier properties and the adhesion are improved. As the oxygen introduction position, it is more preferable to introduce oxygen from the upstream side or the base material, or from the upstream side and the downstream side of the base material.

An example of a method of forming the layer A according to the winding-type vacuum deposition apparatus of FIG. 2 is shown. An aluminum oxide vapor deposition layer is provided as the layer A on the surface of a base material 1 by an electron beam (EB) heating vapor deposition method. First, as a vapor deposition material, aluminum granules are set in the evaporation source 15. In a winding chamber 4, aluminum granules are set on an unwinding roll 5 such that a surface of the base material 1 on which the layer A is provided faces the evaporation source 15, and allowed to pass through a main drum 9 via unwinding guide rolls 6, 7, and 8. Next, the pressure on the inside of the vacuum deposition apparatus 3 is reduced to 5.0×10⁻³ Pa or less by a vacuum pump. The ultimate vacuum is preferably 5.0× 10⁻² Pa or less. When the ultimate vacuum is 5.0×10⁻³ Pa or less, the amount of residual gas in the vacuum deposition apparatus is reduced, and the film quality of the layer A is improved. The temperature of the main drum 9 is set to −30° C. as an example. From the viewpoint of preventing the heat damage of the base material, the temperature is preferably 20° C. or lower, and more preferably 0° C. or lower. Next, aluminum in the evaporation source is melted by using an electron gun (EB gun) 17 as a heating source. After all the aluminum granules are melted, a linear anode layer-type ion source 14 (Veeco, Inc., ALS 1000 L) installed at a distance of 50 mm from the film running surface is introduced with oxygen at 8 L/min and operated at an anode voltage of 10 kV and an anode current of 8.6 A to treat the base material surface. Thereafter, the acceleration current, the film conveyance speed, and the oxygen gas introduction amount are adjusted such that the EB gun and the layer A to be formed have a thickness of 5 nm, and the layer A is formed on the surface of the base material 1. The oxygen gas introduction position is used alone or in plural from among the oxygen gas introduction pipes 16a to 16d depending on the target film quality. As the oxygen gas introduction pipe, one having a tubular shape of which the introduction direction is one direction as shown in FIG. 4 is used. From the viewpoint of improving the film quality at the initial stage of vapor deposition and improving adhesion and barrier properties, it is preferable to use 16a and 16b. From the viewpoint of improving the film quality of the entire layer A and improving the barrier properties, it is preferable to use 16d and then use 16a and/or 16c. Then, the base material 1 is wound on the winding roll 13 via guide rolls 10, 11, and 12. The base material surface treatment by the ion source and the deposition of the layer A may be performed in the same conveyance, or may be performed in separate conveyance.

Base Material

The base material is preferably in the form of a film from the viewpoint of ensuring flexibility. As a configuration of the film, a monolayer film or a film having two or more layers produced by, for example, a coextrusion method may be adopted. As the type of the film, a nonstretched, uniaxially stretched, or biaxially stretched film or the like may be used.

The material of the base material is not particularly limited, but the material mainly composed of an organic polymer is preferable. Examples of the organic polymer that can be suitably used include crystalline polyolefins such as polyethylene and polypropylene; amorphous cyclic polyolefins having a cyclic structure; polyesters such as polyethylene terephthalate and polyethylene naphthalate; and various polymers such as polyamide, polycarbonate, polystyrene, polyvinyl alcohol, saponification products of ethylene vinyl acetate copolymers, polyacrylonitrile, and polyacetal. Among them, polyethylene terephthalate and polypropylene which are excellent in transparency and versatility are preferably used. The organic polymer may be either a homopolymer or a copolymer, and as the organic polymer, only one type may be used, or a plurality of types may be blended and used.

The surface of the base material on which the layer A is to be formed may be subjected to pretreatment such as corona treatment, plasma treatment, ultraviolet ray treatment, ion bombardment treatment, solvent treatment, or formation treatment of an anchor coating layer composed of organic or inorganic substances or a mixture thereof to improve adhesion and smoothness. On the side opposite to the side on which the layer A is to be formed, a coating layer of an organic or inorganic substance, or a mixture thereof may be laminated for the purpose of improving the slip properties of the base material during winding and the scratch resistance of the base material.

The thickness of the base material is not particularly limited, but the thickness is preferably 200 μm or less from the viewpoint of ensuring flexibility, and preferably 5 μm or more from the viewpoint of ensuring strength against tension and impact. Furthermore, the thickness of the base material is more preferably 10 μm or more from the viewpoint of ease of processability and handleability of the film, and 25 μm or less from the viewpoint of use in a packaging material.

Other Layers

An overcoat layer may be formed on the outermost surface of the laminate, that is, on the layer A for the purpose of improving scratch resistance, printability, retort resistance and the like within a range in which the gas barrier properties are not deteriorated, and a lamination configuration in which the adhesion layers or films made of an organic polymer compound for bonding are laminated may be used. The outermost surface here refers to the surface of the layer A after the layer A is laminated on the base material.

Applications of Laminate

The laminate has excellent barrier properties against oxygen and water vapor, because of less variation and low cost, the laminate can be suitably used as a gas barrier film. The laminate can be suitably used as a packaging material for foods, pharmaceuticals, electronic components and the like.

EXAMPLES

Hereinafter, our laminates and methods will be specifically described with reference to Examples. This disclosure should not be construed as limited to the Examples below.

Evaluation Method (1) Scanning Transmission Electron Microscope (STEM) Observation A sample for cross-sectional observation was prepared by the FIB method using a micro sampling system (Helios G4 manufactured by FEI). Using a scanning transmission electron microscope (JEM-ARM 200 F manufactured by JEOL Ltd.), the cross section of the sample for observation was observed at an acceleration voltage of 200 kV, the layer A of the laminate was specified, and the thickness thereof was measured.

(2) EELS Analysis

EELS analysis of the layer A was performed using an EELS detector (GATAN GIF Quantum). As specific measurement conditions, analysis was performed at each site (X portion, Y portion, Z portion) at an acceleration voltage of 200 kV, a beam diameter of 0.2 nmφ, and an energy resolution of 0.5 eV FWHM (full width at half maximum) to obtain an absorption spectrum of an oxygen K-edge. With respect to the thickness of the layer A, the interface between the layer A and the base material side was set to 0%, the outermost surface was set to 100%, analysis was performed at positions of 5 to 25% for the X portion, 40 to 60% for the Y portion, and 75 to 95% for the Z portion, and an average value of the regions was used as an analysis result.

Thereafter, $I_X(530)/I_X(540)$ as $I_X$, $I_Y(530)/I_Y(530)$ as $I_Y$, and $I_Z(530)/I_Z(530)$ as $I_Z$ were calculated from the peak intensities $I_X(540)$, $I_Y(530)$, and $I_Z(540)$ in the vicinity of 530 eV and the peak intensities $I_X(540)$, $I_Y(540)$, and $I_Z(540)$ in the vicinity of 540 eV, and $I_X+I_Y+I_Z$ was determined as $I(530)/I(540)$ of the layer A.

(3) Composition of Layer A

The composition analysis of the layer A of the laminate was performed by the HRRBS/HR-HFS method. Detailed measurement conditions were as follows:

HR-RBS Measurement

Apparatus: RBS analyzer HRBS 500 manufactured by Kobe Steel, Ltd.

Incident ions: $He^+$

Incident energy: 450 eV

Incident angle: 60 deg

Scattering angle: 60 deg

Sample current: 30 nA

Irradiation amount: 12.5 μC

HR-HFS Measurement

Apparatus: RBS analyzer HRBS 500 manufactured by Kobe Steel, Ltd.

Incident ions: $N^+$

Incident energy: 480 eV

Incident angle: 70 deg

Scattering angle: 30 deg

Sample current: 2 nA

Irradiation amount: 0.4 μC.

(4) Oxygen Permeability (Cc/m²/Day)

The oxygen permeability of the laminate was measured at 23° C. and 0% RH using an oxygen transmittance measurement apparatus OX-TRAN 2/20 manufactured by MOCON, Inc. in accordance with JISK 7126-2 (established Aug. 20, 2006). Five samples collected from different positions were averaged, and the value was taken as the oxygen permeability (cc/m²/day). In addition, five standard deviations were calculated as variations.

(5) Water Vapor Permeability (g/m²/Day)

The water vapor permeability of the laminate was measured at 40° C. and 90% RH using a water vapor transmittance measurement apparatus Permatran-W3/30 manufactured by MOCON, Inc. in accordance with JISK 7129B (established Mar. 20, 2008). Five samples collected from different positions were averaged, and the value was taken as the water vapor permeability (g/m²/day). In addition, five standard deviations were calculated as variations.

(6) Total Light Transmittance

Regarding the total light transmittance of the laminate, the total light transmittance was measured using a haze meter NDH 4000 manufactured by Nippon Denshoku Industries Co., Ltd. based on JISK 7361 (established in 1997). The measurement was performed twice, the obtained data was averaged, the second decimal place was rounded off, the average value at the relevant level was obtained, and the value was taken as the total light transmittance (%).

First, Examples and Comparative Examples of a laminate having the layer A on at least one side of the base material, in which the layer A contains at least aluminum (Al) and oxygen (O), and when a site corresponding to 5.0 to 25.0%, a site corresponding to 40.0 to 60.0%, and a site corresponding to 75.0 to 95.0%, in terms of length in a depth direction in the layer A, are defined as the X portion, the Y portion, and the Z portion, respectively, there are sites having a different composition ratio O/Al of aluminum (Al) and oxygen (O), will be described.

Example 1

Formation of Layer A

An aluminum oxide vapor deposition layer with a target thickness of 8 nm was provided as the layer A by an electron beam (EB) vapor deposition method using the winding-type vacuum deposition apparatus 3 illustrated in FIG. 2. A polyethylene terephthalate film (Lumirror (registered trademark) P60, manufactured by Toray Industries, Inc.) having a thickness of 12 m was used as a base material.

Concrete operations were as described below. Granular aluminum (manufactured by Vacuum Metallurgical Co., Ltd., purity: 99.99%) having a size of approximately 2 to 5 mm was set as a vapor deposition material in the evaporation source 15. In the winding chamber 4, aluminum granules were set on the unwinding roll 5 such that a surface of the base material 1 on which the layer A was provided faced the evaporation source 15, and allowed to pass through the main drum 9 via the unwinding rolls 6, 7, and 8. At this time, the temperature of the main drum was controlled to −30° C. Next, the pressure on the inside of the vacuum deposition apparatus 3 was reduced to $3.0 \times 10^{-3}$ Pa by a vacuum pump. Next, using the electron gun 17 as a heating source, aluminum was melted until the aluminum was no longer granular. Thereafter, the linear anode layer-type ion source 14 (Veeco, Inc., ALS 1000 L) installed at a distance of 50 mm from the film running surface was introduced with oxygen at 8 L/min and operated at an anode voltage of 10 kV and an anode current of 8.6 A to treat the base material surface. As a power source for an ion source, an SH type power source manufactured by Glassman High Voltage, Inc. was used. Next, a total of 10 L/min of oxygen gas was introduced (that is, the oxygen gas is introduced at a rate of 1 L/min from the oxygen gas introduction pipe 16a and 9 L/min from the oxygen gas introduction pipe 16b) at a ratio of 1:9 from the oxygen gas introduction pipes 16a and 16b, and the input power, the input current, and the conveyance speed were adjusted such that the target thickness of the layer A to be formed was 8 nm, thereby forming the layer A on the surface of the base material 1. As the oxygen gas introduction pipe, a pipe having a tubular shape as shown in FIG. 4 was used.

Then, the base material was wound on the winding roll 13 via the guide rolls 10, 11, and 12.

Example 2

A laminate was obtained in the same manner as Example 1, except that a total of 10 L/min of oxygen gas was introduced from the oxygen gas introduction pipes 16a and 16c at a ratio of 1:1 when the layer A was formed.

Example 3

A laminate was obtained in the same manner as Example 1, except that the oxygen gas was introduced only from the oxygen gas introduction pipe 16a at a total rate of 10 L/min when the layer A was formed.

Example 4

A laminate was obtained in the same manner as Example 1, except that the pressure in the vacuum apparatus was reduced to $8.0 \times 10^{-3}$ Pa to form the layer A.

Example 5

A laminate was obtained in the same manner as Example 1, except that the pressure in the vacuum apparatus was reduced to $3.0 \times 10^{-2}$ Pa to form the layer A.

Example 6

A laminate was obtained in the same manner as Example 1, except that a total of 10 L/min of oxygen gas was introduced from the oxygen gas introduction pipes 16a and 16b at a ratio of 1:4 when the layer A was formed.

Example 7

A laminate was obtained in the same manner as Example 1, except that a total of 10 L/min of oxygen gas was introduced from the oxygen gas introduction pipes 16a and 16b at a ratio of 0.5:9.5 when the layer A was formed.

Example 8

A laminate was obtained in the same manner as in Example 1, except that the layer A to be formed was vapor-deposited with a target thickness of 5 nm.

Example 9

A laminate was obtained in the same manner as in Example 1, except that the layer A to be formed was vapor-deposited with a target thickness of 13 nm.

Example 10

A laminate was obtained in the same manner as Example 1, except that the oxygen gas was introduced only from the oxygen gas introduction pipe 16b at a total rate of 10 L/min when the layer A was formed.

Example 11

A laminate was obtained in the same manner as Example 1, except that a total of 10 L/min of oxygen gas was introduced from the oxygen gas introduction pipes 16b and 16c at a ratio of 9:1 when the layer A was formed.

Example 12

A laminate was obtained in the same manner as Example 1, except that the oxygen gas was introduced only from the oxygen gas introduction pipe 16c at a total rate of 10 L/min when the layer A was formed.

Example 13

A laminate was obtained in the same manner as Example 1, except that a total of 10 L/min of oxygen gas was introduced from the oxygen gas introduction pipes 16a, 16b, and 16c at a ratio of 1:8:1 when the layer A was formed.

Example 14

A laminate was obtained in the same manner as Example 2, except that a total of 10 L/min of oxygen gas was introduced from the oxygen gas introduction pipes 16a and 16c at a ratio of 0.5:9.5 when the layer A was formed.

Example 15

A laminate was obtained in the same manner as Example 2, except that a total of 10 L/min of oxygen gas was introduced from the oxygen gas introduction pipes 16a and 16c at a ratio of 9.5:0.5 when the layer A was formed.

Comparative Example 1

A laminate was obtained in the same manner as in Example 1, except that oxygen gas was not introduced during formation of the layer A.

Comparative Example 2

A laminate was obtained in the same manner as Example 1, except that the oxygen gas introduction amount from the oxygen gas introduction pipes 16a and 16b was set to 1 L/min in total when the layer A was formed.

Comparative Example 3

A laminate was obtained in the same manner as Example 1, except that the oxygen gas introduction amount from the oxygen gas introduction pipes 16a and 16b was set to 20 L/min in total when the layer A was formed.

Comparative Example 4

A laminate was obtained in the same manner as Example 1, except that oxygen gas introduction pipes 16a and 16b having a pinhole shape as shown in FIG. 3 were used when the layer A was formed.

For the laminates obtained in each of Examples and Comparative Examples, test pieces were cut out, and various evaluations were performed. The results are shown in Tables 1 to 3.

TABLE 1

| | | EELS analysis, Oxygen K-edge I (530)/I (540) | | | Composition ratio X portion | | | | | |
|---|---|---|---|---|---|---|---|---|---|---|
| | Film material | X portion | Y portion | Z portion | Al [atm %] | O [atm %] | H [atm %] | Total | O/Al | H/Al |
| Example 1 | AlOx | 0.03 | 0.26 | 0.09 | 22.9 | 49.4 | 27.7 | 100.0 | 2.16 | 1.21 |
| Example 2 | AlOx | 0.04 | 0.67 | 0.07 | 23.0 | 48.9 | 28.1 | 100.0 | 2.13 | 1.22 |
| Example 3 | AlOx | 0.06 | 0.76 | 0.92 | 22.4 | 49.5 | 28.1 | 100.0 | 2.21 | 1.25 |
| Example 4 | AlOx | 0.16 | 1.09 | 0.26 | 19.8 | 46.7 | 33.5 | 100.0 | 2.36 | 1.69 |
| Example 5 | AlOx | 0.24 | 1.73 | 0.35 | 21.0 | 47.3 | 31.7 | 100.0 | 2.25 | 1.51 |
| Example 6 | AlOx | 0.05 | 0.30 | 0.08 | 25.6 | 52.7 | 21.7 | 100.0 | 2.06 | 0.85 |
| Example 7 | AlOx | 0.09 | 0.23 | 0.10 | 22.4 | 47.9 | 29.7 | 100.0 | 2.14 | 1.33 |
| Example 8 | AlOx | 0.04 | 0.28 | 0.10 | 23.1 | 49.5 | 27.4 | 100.0 | 2.14 | 1.19 |
| Example 9 | AlOx | 0.05 | 0.25 | 0.08 | 22.9 | 49.2 | 27.9 | 100.0 | 2.15 | 1.22 |
| Example 10 | AlOx | 0.26 | 0.40 | 0.32 | 23.3 | 47.9 | 28.8 | 100.0 | 2.06 | 1.24 |
| Example 11 | AlOx | 0.12 | 0.38 | 0.07 | 24.1 | 47.8 | 28.1 | 100.0 | 1.98 | 1.17 |
| Example 12 | AlOx | 1.18 | 0.55 | 0.12 | 22.7 | 46.1 | 31.2 | 100.0 | 2.03 | 1.37 |
| Example 13 | AlOx | 0.03 | 0.23 | 0.07 | 23.6 | 49.7 | 26.7 | 100.0 | 2.11 | 1.13 |
| Example 14 | AlOx | 0.84 | 0.52 | 0.10 | 23.2 | 46.6 | 30.2 | 100.0 | 2.01 | 1.30 |
| Example 15 | AlOx | 0.06 | 0.85 | 0.34 | 22.6 | 49.2 | 28.2 | 100.0 | 2.18 | 1.25 |
| Comparative Example 1 | Al | 0.02 | 0.05 | 0.04 | 91.8 | 4.5 | 3.7 | 100.0 | 0.05 | 0.04 |
| Comparative Example 2 | AlOx | 0.34 | 0.97 | 0.42 | 40.7 | 48.3 | 11.0 | 100.0 | 1.19 | 0.27 |
| Comparative Example 3 | AlOx | 0.24 | 1.50 | 0.28 | 19.8 | 45.9 | 34.3 | 100.0 | 2.32 | 1.73 |
| Comparative Example 4 | AlOx | 0.56 | 0.34 | 0.63 | 20.6 | 46.3 | 33.1 | 100.0 | 2.25 | 1.61 |

Layer A
Composition ratio
Y portion

| | Al [atm %] | O [atm %] | H [atm %] | Total | O/Al | H/Al |
|---|---|---|---|---|---|---|
| Example 1 | 27.2 | 48.3 | 24.5 | 100.0 | 1.78 | 0.90 |
| Example 2 | 27.5 | 45.6 | 26.9 | 100.0 | 1.66 | 0.98 |
| Example 3 | 27.1 | 43.9 | 29.0 | 100.0 | 1.62 | 1.07 |
| Example 4 | 23.2 | 47.2 | 29.6 | 100.0 | 2.03 | 1.28 |
| Example 5 | 23.9 | 48.5 | 27.6 | 100.0 | 2.03 | 1.15 |
| Example 6 | 27.0 | 52.9 | 20.1 | 100.0 | 1.96 | 0.74 |
| Example 7 | 26.5 | 51.6 | 21.9 | 100.0 | 1.95 | 0.83 |
| Example 8 | 27.1 | 48.6 | 24.3 | 100.0 | 1.79 | 0.90 |
| Example 9 | 26.9 | 48.8 | 24.3 | 100.0 | 1.81 | 0.90 |
| Example 10 | 26.4 | 48.4 | 25.2 | 100.0 | 1.83 | 0.95 |
| Example 11 | 26.5 | 47.6 | 25.9 | 100.0 | 1.80 | 0.98 |
| Example 12 | 26.7 | 45.6 | 27.7 | 100.0 | 1.71 | 1.04 |
| Example 13 | 27.0 | 48.4 | 24.6 | 100.0 | 1.79 | 0.91 |
| Example 14 | 27.3 | 45.5 | 27.2 | 100.0 | 1.67 | 1.00 |
| Example 15 | 27.0 | 43.6 | 29.4 | 100.0 | 1.61 | 1.09 |
| Comparative Example 1 | 93.5 | 3.9 | 2.6 | 100.0 | 0.04 | 0.03 |
| Comparative Example 2 | 41.6 | 49.9 | 8.5 | 100.0 | 1.20 | 0.20 |
| Comparative Example 3 | 21.2 | 48.1 | 30.7 | 100.0 | 2.27 | 1.45 |
| Comparative Example 4 | 22.4 | 48.7 | 28.9 | 100.0 | 2.17 | 1.29 |

TABLE 2

Layer A
Composition ratio

| | Z portion | | | | | | Difference in O/Al value | | |
|---|---|---|---|---|---|---|---|---|---|
| | Al [atm %] | O [atm %] | H [atm %] | Total | O/Al | H/Al | X-Y | Y-Z | Z-X |
| Example 1 | 26.9 | 48.2 | 24.9 | 100.0 | 1.79 | 0.92 | 0.38 | −0.01 | −0.37 |
| Example 2 | 26.2 | 49.8 | 24.0 | 100.0 | 1.90 | 0.92 | 0.47 | −0.24 | −0.23 |
| Example 3 | 26.1 | 44.5 | 29.4 | 100.0 | 1.70 | 1.13 | 0.59 | −0.09 | −0.50 |

TABLE 2-continued

| Example 4 | 21.3 | 48.0 | 30.7 | 100.0 | 2.25 | 1.44 | 0.32 | -0.22 | -0.11 |
|---|---|---|---|---|---|---|---|---|---|
| Example 5 | 22.0 | 48.9 | 29.1 | 100.0 | 2.22 | 1.32 | 0.22 | -0.19 | -0.03 |
| Example 6 | 25.9 | 53.9 | 20.2 | 100.0 | 2.08 | 0.78 | 0.10 | -0.12 | 0.02 |
| Example 7 | 26.1 | 49.6 | 24.3 | 100.0 | 1.90 | 0.93 | 0.19 | 0.05 | -0.24 |
| Example 8 | 26.9 | 48.5 | 24.6 | 100.0 | 1.80 | 0.91 | 0.35 | -0.01 | -0.34 |
| Example 9 | 26.8 | 48.0 | 25.2 | 100.0 | 1.79 | 0.94 | 0.33 | 0.02 | -0.36 |
| Example 10 | 25.9 | 49.5 | 24.6 | 100.0 | 1.91 | 0.95 | 0.22 | -0.08 | -0.14 |
| Example 11 | 26.3 | 49.5 | 24.2 | 100.0 | 1.88 | 0.92 | 0.19 | -0.09 | -0.10 |
| Example 12 | 26.6 | 48.7 | 24.7 | 100.0 | 1.83 | 0.93 | 0.32 | -0.12 | -0.20 |
| Example 13 | 26.6 | 49.6 | 23.8 | 100.0 | 1.86 | 0.89 | 0.31 | -0.07 | -0.24 |
| Example 14 | 26.9 | 48.7 | 24.4 | 100.0 | 1.81 | 0.91 | 0.34 | -0.14 | -0.20 |
| Example 15 | 27.2 | 47.1 | 25.7 | 100.0 | 1.73 | 0.94 | 0.56 | -0.12 | -0.45 |
| Comparative Example 1 | 93.0 | 4.1 | 2.9 | 100.0 | 0.04 | 0.03 | 0.01 | 0.00 | 0.00 |
| Comparative Example 2 | 41.0 | 49.3 | 9.7 | 100.0 | 1.20 | 0.24 | -0.01 | 0.00 | 0.02 |
| Comparative Example 3 | 20.2 | 46.8 | 33.0 | 100.0 | 2.32 | 1.63 | 0.05 | -0.05 | 0.00 |
| Comparative Example 4 | 21.0 | 47.1 | 31.9 | 100.0 | 2.24 | 1.52 | 0.07 | -0.07 | 0.00 |

Layer A

| | Composition ratio Average composition | | | | | | Total light | |
|---|---|---|---|---|---|---|---|---|
| | Al [atm %] | O [atm %] | H [atm %] | Total | O/Al | H/Al | transmittance [%] | Thickness [nm] |
| Example 1 | 25.7 | 48.6 | 25.7 | 100.0 | 1.89 | 1.00 | 89.0 | 7.8 |
| Example 2 | 25.6 | 48.1 | 26.3 | 100.0 | 1.88 | 1.03 | 88.4 | 7.9 |
| Example 3 | 25.2 | 46.0 | 28.8 | 100.0 | 1.82 | 1.14 | 87.4 | 7.5 |
| Example 4 | 21.4 | 47.3 | 31.3 | 100.0 | 2.21 | 1.46 | 89.6 | 7.9 |
| Example 5 | 22.3 | 48.2 | 29.5 | 100.0 | 2.16 | 1.32 | 89.3 | 7.6 |
| Example 6 | 26.2 | 53.2 | 20.7 | 100.0 | 2.03 | 0.79 | 89.7 | 7.4 |
| Example 7 | 25.0 | 49.7 | 25.3 | 100.0 | 1.99 | 1.01 | 88.2 | 7.9 |
| Example 8 | 25.7 | 48.9 | 25.4 | 100.0 | 1.90 | 0.99 | 89.5 | 5.1 |
| Example 9 | 25.5 | 48.7 | 25.8 | 100.0 | 1.91 | 1.01 | 88.7 | 12.6 |
| Example 10 | 25.2 | 48.6 | 26.2 | 100.0 | 1.93 | 1.04 | 87.9 | 7.8 |
| Example 11 | 25.6 | 48.3 | 26.1 | 100.0 | 1.88 | 1.02 | 83.6 | 7.2 |
| Example 12 | 25.3 | 46.8 | 27.9 | 100.0 | 1.85 | 1.10 | 76.5 | 7.9 |
| Example 13 | 25.7 | 49.2 | 25.0 | 100.0 | 1.91 | 0.97 | 88.8 | 7.8 |
| Example 14 | 25.8 | 46.9 | 27.3 | 100.0 | 1.82 | 1.06 | 87.9 | 7.7 |
| Example 15 | 25.6 | 46.6 | 27.8 | 100.0 | 1.82 | 1.08 | 87.5 | 7.7 |
| Comparative Example 1 | 92.8 | 4.2 | 3.1 | 100.0 | 0.04 | 0.03 | 69.5 | 7.7 |
| Comparative Example 2 | 41.1 | 49.2 | 9.7 | 100.0 | 1.20 | 0.24 | 80.8 | 7.5 |
| Comparative Example 3 | 20.4 | 46.9 | 32.7 | 100.0 | 2.30 | 1.60 | 88.7 | 7.9 |
| Comparative Example 4 | 21.3 | 47.4 | 31.3 | 100.0 | 2.22 | 1.47 | 88.5 | 7.8 |

TABLE 3

| | Oxygen permeability [cc/m²/day] | | | | | | |
|---|---|---|---|---|---|---|---|
| | Measurement sample | | | | | N = 5 average | Standard |
| | n = 1 | n = 2 | n = 3 | n = 4 | n = 5 | value | deviation |
| Example 1 | 0.7 | 0.6 | 0.5 | 0.6 | 0.6 | 0.60 | 0.06 |
| Example 2 | 1.2 | 1.1 | 0.7 | 1.0 | 1.0 | 1.00 | 0.17 |
| Example 3 | 0.8 | 1.9 | 2.0 | 1.1 | 0.8 | 1.32 | 0.53 |
| Example 4 | 1.3 | 2.1 | 2.2 | 1.7 | 1.0 | 1.66 | 0.46 |
| Example 5 | 1.5 | 2.4 | 2.1 | 2.4 | 1.6 | 2.00 | 0.38 |
| Example 6 | 0.7 | 0.9 | 0.8 | 0.7 | 0.7 | 0.76 | 0.08 |
| Example 7 | 1.0 | 1.4 | 1.2 | 1.1 | 1.1 | 1.16 | 0.14 |
| Example 8 | 0.5 | 0.6 | 0.8 | 0.9 | 0.9 | 0.74 | 0.16 |
| Example 9 | 0.8 | 0.6 | 0.4 | 0.7 | 0.8 | 0.66 | 0.15 |
| Example 10 | 1.4 | 1.8 | 1.2 | 1.2 | 1.6 | 1.44 | 0.23 |
| Example 11 | 1.0 | 1.5 | 1.1 | 1.1 | 1.3 | 1.20 | 0.18 |
| Example 12 | 1.4 | 2.9 | 2.9 | 1.5 | 2.6 | 2.26 | 0.67 |
| Example 13 | 0.7 | 0.6 | 0.5 | 0.4 | 0.5 | 0.54 | 0.10 |
| Example 14 | 2.6 | 1.8 | 1.6 | 2.8 | 1.9 | 2.14 | 0.47 |
| Example 15 | 1.0 | 1.4 | 1.7 | 1.1 | 1.0 | 1.24 | 0.27 |

TABLE 3-continued

| Comparative Example 1 | 0.6 | 2.4 | 3.2 | 0.6 | 2.6 | 1.88 | 1.08 |
|---|---|---|---|---|---|---|---|
| Comparative Example 2 | 0.8 | 2.2 | 3.1 | 0.9 | 2.8 | 1.96 | 0.95 |
| Comparative Example 3 | 4.0 | 2.9 | 0.3 | 0.6 | 2.8 | 2.12 | 1.43 |
| Comparative Example 4 | 0.4 | 2.6 | 0.7 | 3.2 | 0.3 | 1.44 | 1.21 |

| | Water vapor permeability [g/m²/day] | | | | | | |
|---|---|---|---|---|---|---|---|
| | Measurement sample | | | | | N = 5 average | Standard |
| | n = 1 | n = 2 | n = 3 | n = 4 | n = 5 | value | deviation |
| Example 1 | 0.6 | 0.9 | 0.9 | 1.0 | 0.7 | 0.82 | 0.15 |
| Example 2 | 1.3 | 1.5 | 1.5 | 1.2 | 1.1 | 1.32 | 0.16 |
| Example 3 | 1.0 | 1.7 | 1.2 | 1.6 | 2.7 | 1.64 | 0.59 |
| Example 4 | 1.8 | 1.3 | 1.8 | 1.' | 2.4 | 1.80 | 0.35 |
| Example 5 | 2.1 | 3.0 | 2.6 | 2.2 | 2.6 | 2.50 | 0.32 |
| Example 6 | 1.0 | 1.4 | 1.3 | 1.2 | 1.0 | 1.18 | 0.16 |

TABLE 3-continued

| | | | | | | | |
|---|---|---|---|---|---|---|---|
| Example 7 | 1.5 | 1.8 | 1.1 | 1.5 | 1.0 | 1.38 | 0.29 |
| Example 8 | 1.1 | 1.2 | 0.8 | 1.1 | 1.0 | 1.04 | 0.14 |
| Example 9 | 0.8 | 0.9 | 0.9 | 0.8 | 0.9 | 0.86 | 0.05 |
| Example 10 | 1.9 | 1.5 | 1.4 | 1.2 | 1.3 | 1.46 | 0.24 |
| Example 11 | 1.6 | 1.3 | 1.3 | 1.5 | 1.4 | 1.42 | 0.12 |
| Example 12 | 2.8 | 2.6 | 1.9 | 3.3 | 1.2 | 2.36 | 0.73 |
| Example 13 | 0.6 | 0.6 | 0.7 | 0.7 | 0.7 | 0.66 | 0.05 |
| Example 14 | 2.7 | 1.4 | 2.5 | 2.6 | 1.8 | 2.20 | 0.51 |
| Example 15 | 1.4 | 1.7 | 1.2 | 1.6 | 2.0 | 1.58 | 0.27 |
| Comparative Example 1 | 2.0 | 1.2 | 3.8 | 2.0 | 3.1 | 2.42 | 0.92 |
| Comparative Example 2 | 1.8 | 1.5 | 3.8 | 1.3 | 3.2 | 2.32 | 0.99 |
| Comparative Example 3 | 1.2 | 4.6 | 1.4 | 3.2 | 3.0 | 2.68 | 1.26 |
| Comparative Example 4 | 0.7 | 0.3 | 0.4 | 2.4 | 2.6 | 1.28 | 1.01 |

Next, Examples and Comparative Examples of the laminate having the layer A on at least one side of the base material, in which the layer A contains at least aluminum (Al) and oxygen (O), and when a peak intensity in the vicinity of 530 eV of an oxygen K-edge spectrum in EELS analysis in the layer A is defined as I(530), and a peak intensity in the vicinity of 540 eV is defined as I(540), I(530)/I(540)≤1.50 is satisfied, will be described.

Example 16

Formation of Layer A

An aluminum oxide vapor deposition layer with a target thickness of 8 nm was provided as the layer A by an electron beam (EB) vapor deposition method using the winding-type vacuum deposition apparatus 3 illustrated in FIG. 2. A polyethylene terephthalate film (Lumirror (registered trademark) P60, manufactured by Toray Industries, Inc.) having a thickness of 12 m was used as a base material.

Concrete operations were as described below. Granular aluminum (manufactured by Vacuum Metallurgical Co., Ltd., purity: 99.99%) having a size of approximately 2 to 5 mm was set as a vapor deposition material in the evaporation source 15. In the winding chamber 4, aluminum granules were set on the unwinding roll 5 such that a surface of the base material 1 on which the layer A was provided faced the evaporation source 15, and allowed to pass through the main drum 9 via the unwinding rolls 6, 7, and 8. At this time, the temperature of the main drum was controlled to −30° C. Next, the pressure on the inside of the vacuum deposition apparatus 3 was reduced to $3.0 \times 10^{-3}$ Pa by a vacuum pump. Next, using the electron gun 17 as a heating source, aluminum was melted until the aluminum was no longer granular. Thereafter, the linear anode layer-type ion source 14 (Veeco, Inc., ALS 1000 L) installed at a distance of 50 mm from the film running surface was introduced with oxygen at 8 L/min and operated at an anode voltage of 10 kV and an anode current of 8.6 A to treat the base material surface. As a power source for an ion source, an SH type power source manufactured by Glassman High Voltage, Inc. was used. Next, a total of 10 L/min of oxygen gas was introduced (that is, the oxygen gas is introduced at a rate of 1 L/min from the oxygen gas introduction pipe 16a and 9 L/min from the oxygen gas introduction pipe 16d) at a ratio of 1:9 from the oxygen gas introduction pipes 16a and 16d, and the input power, the input current, and the conveyance speed were adjusted such that the target thickness of the layer A to be formed was 8 nm, thereby forming the layer A on the surface of the base material 1. As the oxygen gas introduction pipe, a pipe having a pinhole shape as shown in FIG. 3 was used.

Then, the base material was wound on the winding roll 13 via the guide rolls 10, 11, and 12.

Example 17

A laminate was obtained in the same manner as Example 16, except that a total of 10 L/min of oxygen gas was introduced from the oxygen gas introduction pipes 16a and 16d at a ratio of 1:4 when the layer A was formed.

Example 18

A laminate was obtained in the same manner as Example 16, except that a total of 10 L/min of oxygen gas was introduced from the oxygen gas introduction pipes 16a and 16d at a ratio of 0.5:9.5 when the layer A was formed.

Example 19

A laminate was obtained in the same manner as in Example 16, except that the layer A to be formed was vapor-deposited with a target thickness of 5 nm.

Example 20

A laminate was obtained in the same manner as in Example 16, except that the layer A to be formed was vapor-deposited with a target thickness of 13 nm.

Example 21

A laminate was obtained in the same manner as Example 16, except that the oxygen gas was introduced only from the oxygen gas introduction pipe 16d at a total rate of 10 L/min when the layer A was formed.

Example 22

A laminate was obtained in the same manner as Example 16, except that a total of 10 L/min of oxygen gas was introduced from the oxygen gas introduction pipes 16d and 16c at a ratio of 9:1 when the layer A was formed.

Example 23

A laminate was obtained in the same manner as Example 16, except that a total of 10 L/min of oxygen gas was introduced from the oxygen gas introduction pipes 16a, 16d, and 16c at a ratio of 1:8:1 when the layer A was formed.

Example 24

A laminate was obtained in the same manner as Example 16, except that a total of 10 L/min of oxygen gas was introduced from the oxygen gas introduction pipes 16a, 16d, and 16c at a ratio of 3:4:3 when the layer A was formed.

Comparative Example 5

A laminate was obtained in the same manner as Example 16, except that the oxygen gas introduction amount from the oxygen gas introduction pipes 16a and 16d was set to 1 L/min in total when the layer A was formed.

Comparative Example 6

A laminate was obtained in the same manner as Example 16, except that the oxygen gas introduction amount from the oxygen gas introduction pipes 16a and 16d was set to 20 L/min in total when the layer A was formed.

Comparative Example 7

A laminate was obtained in the same manner as Example 16, except that the oxygen gas introduction pipes 16a and 16d having a tubular shape in which the introduction direction was one direction as shown in FIG. 4 were used when the layer A was formed.

Comparative Example 8

A laminate was obtained in the same manner as Example 16, except that a deposition preventive plate 18 was not used when the layer A was formed.

For the laminates obtained in each of Examples and Comparative Examples, test pieces were cut out, and various evaluations were performed. The results are shown in Tables 4 and 5.

TABLE 4-1

| | | Layer A | | | | | | |
| | | EELS analysis, Oxygen K-edge I (530)/I (540) | | | | Composition ratio | | |
| | Film material | X portion $I_x$ | Y portion $I_y$ | Z portion $I_z$ | $I_x + I_y + I_z$ | Al [atm %] | O [atm %] |
|---|---|---|---|---|---|---|---|
| Example 16 | AlOx | 0.08 | 0.16 | 0.14 | 0.38 | 25.7 | 48.6 |
| Example 17 | AlOx | 0.12 | 0.19 | 0.16 | 0.47 | 26.2 | 53.2 |
| Example 18 | AlOx | 0.09 | 0.23 | 0.10 | 0.42 | 25.0 | 49.7 |
| Example 19 | AlOx | 0.08 | 0.25 | 0.11 | 0.44 | 25.7 | 48.9 |
| Example 20 | AlOx | 0.05 | 0.25 | 0.08 | 0.38 | 25.5 | 48.7 |
| Example 21 | AlOx | 0.18 | 0.34 | 0.26 | 0.78 | 25.4 | 49.4 |
| Example 22 | AlOx | 0.15 | 0.27 | 0.12 | 0.54 | 25.7 | 46.6 |
| Example 23 | AlOx | 0.07 | 0.17 | 0.09 | 0.33 | 25.6 | 48.6 |
| Example 24 | AlOx | 0.27 | 0.44 | 0.30 | 1.01 | 21.3 | 47.4 |
| Comparative Example 5 | AlOx | 0.42 | 0.75 | 0.56 | 1.73 | 41.1 | 49.2 |
| Comparative Example 6 | AlOx | 0.57 | 0.79 | 0.66 | 2.02 | 20.4 | 46.9 |
| Comparative Example 7 | AlOx | 0.35 | 0.81 | 0.48 | 1.64 | 24.0 | 48.3 |
| Comparative Example 8 | AlOx | 0.56 | 0.34 | 0.63 | 1.53 | 21.3 | 47.4 |

| | | Layer A | | | |
| | | Composition ratio | | Total light transmittance | Thickness |
| | H [atm %] | O/Al | H/Al | [%] | [nm] |
|---|---|---|---|---|---|
| Example 16 | 25.7 | 1.89 | 1.00 | 89.0 | 7.9 |
| Example 17 | 20.7 | 2.03 | 0.79 | 89.7 | 7.6 |
| Example 18 | 25.3 | 1.99 | 1.01 | 88.2 | 7.2 |
| Example 19 | 25.4 | 1.90 | 0.99 | 89.5 | 5.1 |
| Example 20 | 25.8 | 1.91 | 1.01 | 88.7 | 12.6 |
| Example 21 | 25.2 | 1.95 | 0.99 | 87.9 | 7.9 |
| Example 22 | 27.7 | 1.81 | 1.08 | 83.6 | 7.8 |
| Example 23 | 25.7 | 1.90 | 1.00 | 88.8 | 7.9 |
| Example 24 | 31.3 | 2.22 | 1.47 | 88.5 | 7.6 |
| Comparative Example 5 | 9.7 | 1.20 | 0.24 | 80.8 | 7.9 |
| Comparative Example 6 | 32.7 | 2.30 | 1.60 | 88.7 | 7.8 |
| Comparative Example 7 | 27.7 | 2.01 | 1.15 | 89.2 | 7.8 |
| Comparative Example 8 | 31.3 | 2.22 | 1.47 | 88.3 | 7.6 |

TABLE 5

| | Oxygen permeability [cc/m²/day] | | | | | | | |
| | Measurement sample | | | | | N = 5 average | Standard | Standard deviation/ |
| | n = 1 | n = 2 | n = 3 | n = 4 | n = 5 | value | deviation | average value |
|---|---|---|---|---|---|---|---|---|
| Example 16 | 0.7 | 0.6 | 0.5 | 0.6 | 0.6 | 0.6 | 0.1 | 0.105 |
| Example 17 | 0.7 | 0.9 | 0.8 | 0.7 | 0.7 | 0.8 | 0.1 | 0.105 |
| Example 18 | 1.0 | 1.4 | 1.2 | 1.1 | 1.1 | 1.2 | 0.1 | 0.117 |
| Example 19 | 0.5 | 0.6 | 0.8 | 0.9 | 0.9 | 0.7 | 0.2 | 0.220 |

TABLE 5-continued

| | | | | | | | | |
|---|---|---|---|---|---|---|---|---|
| Example 20 | 0.8 | 0.6 | 0.4 | 0.7 | 0.8 | 0.7 | 0.1 | 0.227 |
| Example 21 | 1.4 | 1.8 | 1.2 | 1.2 | 1.6 | 1.4 | 0.2 | 0.162 |
| Example 22 | 1.0 | 1.5 | 1.1 | 1.1 | 1.3 | 1.2 | 0.2 | 0.149 |
| Example 23 | 0.7 | 0.6 | 0.5 | 0.4 | 0.5 | 0.5 | 0.1 | 0.189 |
| Example 24 | 1.8 | 2.5 | 1.6 | 2.0 | 2.3 | 2.0 | 0.3 | 0.160 |
| Comparative Example 5 | 2.7 | 0.6 | 2.9 | 1.0 | 1.8 | 1.8 | 0.9 | 0.503 |
| Comparative Example 6 | 3.0 | 2.5 | 0.7 | 1.9 | 2.8 | 2.2 | 0.8 | 0.380 |
| Comparative Example 7 | 0.4 | 1.6 | 0.5 | 1.9 | 0.4 | 1.0 | 0.7 | 0.680 |
| Comparative Example 8 | 0.2 | 1.5 | 0.4 | 1.4 | 0.3 | 0.8 | 0.6 | 0.747 |

| | Water vapor permeability [g/m²/day] | | | | | | | |
|---|---|---|---|---|---|---|---|---|
| | Measurement sample | | | | | N = 5 average value | Standard deviation | Standard deviation/ average value | Layer A thickness × water vapor permeability |
| | n = 1 | n = 2 | n = 3 | n = 4 | n = 5 | | | | |
| Example 16 | 0.6 | 0.9 | 0.9 | 0.9 | 0.7 | 0.8 | 0.1 | 0.158 | 0.8 |
| Example 17 | 1.0 | 1.4 | 1.3 | 1.2 | 1.0 | 1.2 | 0.2 | 0.136 | 1.2 |
| Example 18 | 1.5 | 1.6 | 1.3 | 1.5 | 1.2 | 1.4 | 0.1 | 0.103 | 1.4 |
| Example 19 | 1. | 1.2 | 0.8 | 1.1 | 1.0 | 1.0 | 0.1 | 0.130 | 1.1 |
| Example 20 | 0.8 | 0.9 | 0.9 | 0.8 | 0.9 | 0.9 | 0.0 | 0.057 | 0.9 |
| Example 21 | 1.9 | 1.5 | 1.4 | 1.2 | 1.3 | 1.5 | 0.2 | 0.166 | 1.6 |
| Example 22 | 1.7 | 1.3 | 1.1 | 1.5 | 1.4 | 1.4 | 0.2 | 0.143 | 1.4 |
| Example 23 | 0.6 | 0.6 | 0.7 | 0.7 | 0.7 | 0.7 | 0.0 | 0.074 | 1.0 |
| Example 24 | 2.2 | 2.4 | 2.0 | 2.3 | 2.8 | 2.3 | 0.3 | 0.113 | 0.1 |
| Comparative Example 5 | 1.6 | 2.2 | 3.2 | 2.8 | 2.7 | 2.5 | 0.6 | 0.221 | 4.0 |
| Comparative Example 6 | 1.2 | 3.9 | 2.5 | 3.2 | 3.0 | 2.8 | 0.9 | 0.326 | 1.8 |
| Comparative Example 7 | 2.1 | 0.4 | 0.6 | 2.3 | 0.7 | 1.2 | 0.8 | 0.663 | 1.8 |
| Comparative Example 8 | 1.1 | 0.3 | 0.4 | 1.8 | 2.1 | 1.1 | 0.7 | 0.634 | 0.0 |

Examples 1 to 15 showed the results that there were sites having different O/Al and the film quality was different in any of the X portion, the Y portion, and the Z portion. In Examples 2 and 3, since the oxidation degree of the Y portion of the layer A was lowered by not using the oxygen gas introduction pipe 16b compared to Example 1, it is considered that the value of I(530)/I(540) of the Y portion is larger than that in Example 1. It is considered that in Examples 4 and 5, I(530)/I(540) became large as a whole because the ultimate vacuum before vapor deposition was not high compared to Example 1. It is considered that in Examples 10 to 12, the oxidation degree of the X portion of the layer A was particularly low compared to Example 1, and the value of I(530)/I(540) of the X portion was larger than that in Example 1. The film quality of each of the X portion, the Y portion, and the Z portion, the average composition of the layer A, and the gas barrier properties could be controlled by changing the position and the shape of the oxygen gas introduction pipe or changing the introduction amount and the introduction ratio of the oxygen gas as in Examples 16 to 24.

In Comparative Example 1, since the layer A was formed without introducing oxygen, the content of the oxygen (O) element in 100.0 atm % of all atoms constituting the layer A was 4.2 atm % and less than 5.0 atm % and, thus, unlike our layer A, the layer was the layer of aluminum (Al) containing no oxygen (O). It is considered that in Comparative Example 2, compared to Example 1, and in Comparative Example 5, compared to Example 16, the oxidation degree was lowered due to the extremely small amount of introduced oxygen, the layer A containing a large amount of Al suboxide was formed, and the film had a large variation in film quality. It is considered that in Comparative Example 3, compared to Example 1, and in Comparative Example 6, compared to Example 16, the amount of introduced oxygen was extremely large, the layer A having many defects was formed, and the film had a large variation in film quality.

INDUSTRIAL APPLICABILITY

Since the laminate is excellent in gas barrier properties against oxygen gas, water vapor and the like, the laminate can be suitably used as a packaging material for foods, pharmaceuticals, electronic components and the like, but the application thereof is not limited thereto.

The invention claimed is:

1. A laminate having a layer A on at least one side of a base material, wherein
the layer A contains at least aluminum (Al) and oxygen (O), and
when a site corresponding to 5.0 to 25.0%, a site corresponding to 40.0 to 60.0%, and a site corresponding to 75.0 to 95.0%, in terms of length in a depth direction in the layer A, are defined as an X portion, a Y portion, and a Z portion, respectively, there are sites having a different composition ratio O/Al of aluminum (Al) and oxygen (O);
wherein $I_X(530)/I_X(540) \leq 0.15$ and/or $I_Z(530)/I_Z(540) \leq 0.25$ is satisfied in the X portion and the Z portion in the layer A.

2. The laminate according to claim 1, wherein hydrogen is further contained in the layer A, and when peak intensities in a vicinity of 530 eV of an oxygen K-edge spectrum of an electron energy loss spectroscopy (EELS) analysis in each of the X portion, the Y portion, and the Z portion are defined as $I_X(530)$, $I_Y(530)$, and $I_Z(530)$, and peak intensities in a vicinity of 540 eV of the oxygen K-edge spectrum of the EELS analysis in each of the X portion, the Y portion, and the Z portion in the layer A are defined as $I_X(540)$, $I_Y(540)$, and $I_Z(540)$, $I_Y(530)/I_Y(540)>I_X(530)/I_X(540)$ and/or Iv $(530)/I_Y(540)>I_Z(530)/I_Z(540)$ is satisfied.

3. A laminate having a layer A on at least one side of a base material, wherein the layer A contains at least aluminum (Al) and oxygen (O), and when a peak intensity in a vicinity of 530 eV of an oxygen K-edge spectrum in EELS analysis in the layer A is defined as I(530), and a peak intensity in a vicinity of 540 eV is defined as I(540), $I(530)/I(540) \leq 1.50$ is satisfied.

4. The laminate according to claim 3, wherein when a thickness of the layer A is X(nm) and a water vapor permeability is Y (g/m²/day), $X \times Y \leq 20.0$.

5. The laminate according to claim 1, wherein a total light transmittance of the laminate is 85.0% or more.

6. The laminate according to claim 1, wherein with respect to an average composition of the layer A, a composition ratio O/Al of aluminum (Al) and oxygen (O) is $1.20 \leq O/Al \leq 2.20$.

7. The laminate according to claim 1, wherein a thickness of the layer A is 15.0 nm or less.

8. The laminate according to claim 1, wherein the layer A contains hydrogen (H), and with respect to the average composition of the layer A, aluminum (Al) atomic concentration:oxygen (O) atomic concentration:hydrogen (H) atomic concentration is 15.0 to 40.0:40.0 to 55.0:10.0 to 35.0 (atm %).

9. A method of manufacturing the laminate according to claim 1, wherein a vapor deposition layer is formed on at least one surface of the base material by evaporating aluminum by a vacuum vapor deposition method and introducing oxygen into aluminum vapor.

10. The method according to claim 9, wherein oxygen is introduced from an upstream side and/or a downstream side of the base material.

11. The method according to claim 9, wherein oxygen is introduced from immediately above an evaporation source.

* * * * *